(12) United States Patent
Terakado et al.

(10) Patent No.: US 11,374,380 B2
(45) Date of Patent: Jun. 28, 2022

(54) SEMICONDUCTOR LASER (71) Applicant: HORIBA, Ltd., Kyoto (JP)

(72) Inventors: Tomoji Terakado, Kyoto (JP); Makoto Matsuhama, Kyoto (JP); Kyoji Shibuya, Kyoto (JP)

(73) Assignee: HORIBA, Ltd., Kyoto (JP)

( * ) Notice: Subject to any disclaimer, the term of this patent is extended or adjusted under 35 U.S.C. 154(b) by 127 days.

(21) Appl. No.: 16/767,707

(22) PCT Filed: Sep. 14, 2018

(86) PCT No.: PCT/JP2018/034153
§ 371 (c)(1),
(2) Date: May 28, 2020

(87) PCT Pub. No.: WO2019/116657
PCT Pub. Date: Jun. 20, 2019

(65) Prior Publication Data
US 2021/0006037 A1  Jan. 7, 2021

(30) Foreign Application Priority Data

Dec. 15, 2017  (JP) .............................. JP2017-240869

(51) Int. Cl.
*H01S 5/026* (2006.01)
*H01S 5/0625* (2006.01)
(Continued)

(52) U.S. Cl.
CPC .......... *H01S 5/0261* (2013.01); *H01S 5/0612* (2013.01); *H01S 5/06258* (2013.01);
(Continued)

(58) Field of Classification Search
CPC .............. H01S 5/1203; H01S 5/06258; H01S 5/06246; H01S 5/0612; H01S 5/0687; H01S 5/06821; H01S 5/12–1246; H01S 5/1243
See application file for complete search history.

(56) References Cited

U.S. PATENT DOCUMENTS

| 4,573,158 A * | 2/1986 | Utaka | H01S 5/0625 |
| | | | 372/32 |
| 4,720,835 A * | 1/1988 | Akiba | H01S 5/164 |
| | | | 372/26 |

(Continued)

FOREIGN PATENT DOCUMENTS

| CN | 103956652 A * | 7/2014 | .......... H01S 5/5027 |
| DE | 112015001051 T5 * | 12/2016 | ......... H01S 5/06258 |

(Continued)

OTHER PUBLICATIONS

ISA Japan Patent Office, International Search Report Issued in International Application No. PCT/JP2018/034153 dated Nov. 27, 2018, WIPO, 4 pages.

(Continued)

*Primary Examiner* — Joshua King
(74) *Attorney, Agent, or Firm* — Alleman Hall Creasman & Tuttle LLP (57) ABSTRACT

Provided is a semiconductor laser including: a core layer having an active layer and a diffraction grating layer optically coupled to the active layer; and paired clad layers arranged sandwiching the core layer, and formed with a waveguide along the core layer, and the semiconductor laser includes: a flat layer provided continuously with the diffraction grating layer along the waveguide; and a temperature control mechanism for controlling the temperature of the flat layer to a temperature different from that of the diffraction grating layer.

7 Claims, 6 Drawing Sheets

(51) Int. Cl.
*H01S 5/34* (2006.01)
*H01S 5/06* (2006.01)
*H01S 5/12* (2021.01)
*H01S 5/068* (2006.01)
*H01S 5/028* (2006.01)
*H01S 5/062* (2006.01)
*H01S 5/0683* (2006.01)
*H01S 5/0687* (2006.01)

(52) U.S. Cl.
CPC .......... *H01S 5/1203* (2013.01); *H01S 5/3402* (2013.01); *H01S 5/0287* (2013.01); *H01S 5/0687* (2013.01); *H01S 5/06246* (2013.01); *H01S 5/06804* (2013.01); *H01S 5/06837* (2013.01)

(56) References Cited

U.S. PATENT DOCUMENTS

| | | | | |
|---|---|---|---|---|
| 4,751,710 | A * | 6/1988 | Yamaguchi | H01S 5/0264 372/44.01 |
| 4,905,253 | A * | 2/1990 | Chraplyvy | H01S 5/06256 372/96 |
| 4,958,357 | A * | 9/1990 | Kinoshita | H01S 5/187 372/96 |
| 5,642,371 | A * | 6/1997 | Tohyama | H01S 5/06258 372/45.01 |
| 5,808,314 | A | 9/1998 | Nakajima et al. | |
| 5,991,061 | A * | 11/1999 | Adams | H01S 5/06258 372/96 |
| 6,108,362 | A * | 8/2000 | Adams | H01S 5/06258 372/50.1 |
| 6,185,232 | B1 * | 2/2001 | Hess, Jr. | H01S 5/0612 372/102 |
| 6,807,201 | B1 * | 10/2004 | Nitta | H01S 5/227 372/29.02 |
| 10,148,067 | B2 * | 12/2018 | Kwon | G02B 6/12 |
| 11,018,475 | B2 * | 5/2021 | Kim | H01S 5/026 |
| 2004/0001522 | A1 * | 1/2004 | Mori | H01S 5/12 372/50.11 |
| 2004/0062286 | A1 * | 4/2004 | Masood | H01S 5/187 372/102 |
| 2008/0291952 | A1 * | 11/2008 | Yamamoto | H01S 5/0265 372/26 |
| 2009/0201964 | A1 * | 8/2009 | Kato | H01S 5/06258 372/50.11 |
| 2010/0297796 | A1 * | 11/2010 | Ishiura | B82Y 20/00 438/31 |
| 2012/0236889 | A1 * | 9/2012 | Caneau | H01S 5/06256 372/45.01 |
| 2013/0308666 | A1 * | 11/2013 | Ishikawa | H01S 5/12 372/34 |
| 2015/0078411 | A1 * | 3/2015 | Bismuto | H01S 5/2275 372/44.01 |
| 2015/0092798 | A1 * | 4/2015 | Ishikawa | H01S 5/02453 372/20 |
| 2015/0092799 | A1 * | 4/2015 | Hasegawa | H01S 5/0261 372/20 |

FOREIGN PATENT DOCUMENTS

| | | | | |
|---|---|---|---|---|
| JP | 60192378 | A * | 9/1985 | ............... H01S 5/12 |
| JP | 61034988 | A * | 2/1986 | ............... H01S 5/12 |
| JP | 61078190 | A | 4/1986 | |
| JP | 62245692 | A | 10/1987 | |
| JP | S62245915 | A | 10/1987 | |
| JP | 03235915 | A | 10/1991 | |
| JP | H10190106 | A * | 7/1998 | |
| JP | 10321951 | A | 12/1998 | |
| JP | 2966485 | B2 * | 10/1999 | ............ H01S 5/227 |
| JP | H11274652 | A | 10/1999 | |
| JP | 2004023029 | A * | 1/2004 | |
| JP | 2004023029 | A | 1/2004 | |
| JP | 2006332375 | A * | 12/2006 | |
| JP | 4104925 | B2 * | 6/2008 | ......... H01S 5/06256 |
| JP | 2009054637 | A | 3/2009 | |
| JP | 2010245387 | A * | 10/2010 | |
| JP | 2013093414 | A | 5/2013 | |
| JP | 2014509084 | A | 4/2014 | |
| JP | 5621706 | B2 * | 11/2014 | |
| JP | 2014220388 | A * | 11/2014 | |
| JP | 2015056660 | A | 3/2015 | |
| JP | 2015536576 | A | 12/2015 | |
| JP | 2017123445 | A | 7/2017 | |
| KR | 20170055902 | A * | 5/2017 | |
| WO | 2012125398 | A1 | 9/2012 | |
| WO | 2014085562 | A1 | 6/2014 | |
| WO | WO-2016038333 | A1 * | 3/2016 | ......... H01S 5/04256 |

OTHER PUBLICATIONS

Japan Patent Office, Office Action Issued in Application No. 2019-558910, dated Sep. 16, 2021, 4 pages.

European Patent Office, Extended European Search Report Issued in Application No. 18888008.2, dated Aug. 17, 2021, Germany, 9 pages.

Japan Patent Office, Office Action Issued in Application No. 2019-558910, dated Mar. 8, 2022, 6 pages.

\* cited by examiner

SEMICONDUCTOR LASER

TECHNICAL FIELD

The present invention relates to a semiconductor laser used for, for example, exhaust gas component analysis or the like, and in particular, to a quantum cascade laser or the like.

BACKGROUND ART

Recently, there has been proposed a quantum cascade laser (hereinafter also referred to as a QCL) that oscillates laser light in a mid-infrared range as a light source used for the component analysis of sample gas such as exhaust gas. This sort of QCL can output very sharp single wavelength laser light, and can therefore improve analysis accuracy.

Meanwhile, analysis sometimes requires measurement using light beams having multiple wavelengths by wavelength sweeping or the like. Therefore, in conventional QCLs, a wavelength is tuned by changing injection current.

However, in such a case, a large difference may occur between the intensity of laser light at some wavelength and the intensity of laser light at another wavelength, and for example, when quantifying concentration at such respective wavelengths, there may occur a problem of an unstable S/N ratio because of the difference in laser light intensity.

Figure 6:
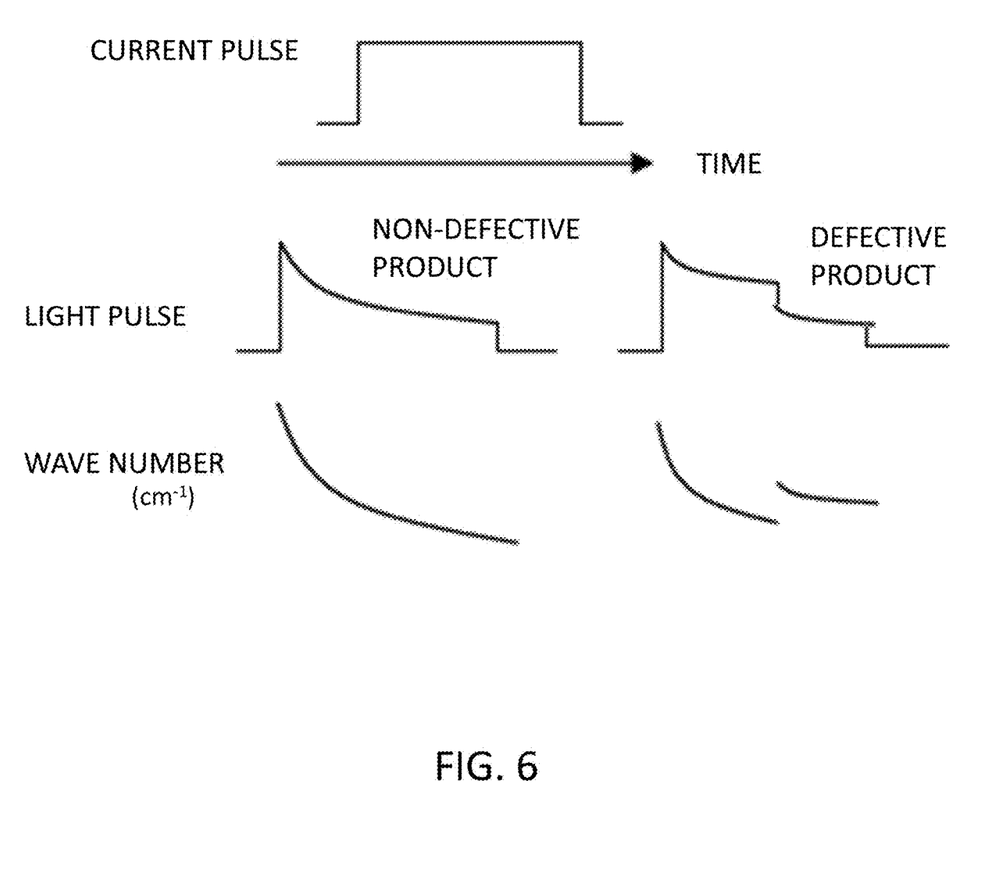
FIG. 6 is a diagram for explaining a wavelength jump that has occurred in a conventional distributed feedback QCL.

Also, for example, in the case of a distributed feedback QCL having a DFB structure, a sharp resonance phenomenon occurs by positionally accurately forming the reflective end surface of a diffraction grating so as to obtain a predetermined light phase ($\lambda/4$); however, the reflective end surface is formed by cleavage, and therefore a phase shift as illustrated in FIG. 6 is likely to occur to cause a wavelength jump. For this reason, there is also a problem that a non-defective yield is very low (e.g., around approximately 30%).

CITATION LIST

Patent Literatures

Patent Literature 1
Japanese Unexamined Patent Publication JP-A2017-123445

SUMMARY OF INVENTION

Technical Problem

The present invention has been made in order to solve the problems described above, and a main intended object thereof is to make it possible to tune a wavelength while suppressing a variation in the intensity of laser light in a semiconductor laser such as a QCL. In addition, secondarily, an intended object is also an improvement in non-defective yield, or the like.

Solution to Problem

That is, the semiconductor laser according to the present invention is one including: a core layer having an active layer and a diffraction grating layer optically coupled to the active layer; and paired clad layers arranged sandwiching the core layer, and formed with a waveguide along the core layer. Further, the semiconductor laser includes: a flat layer provided continuously with the diffraction grating layer along the waveguide; and a temperature control mechanism for controlling the temperature of the flat layer to a temperature different from the diffraction grating layer.

Such a configuration makes it possible to, while suppressing a variation in the intensity of laser light outputted by injecting a constant current into the active layer, tune a laser oscillation wavelength by controlling the temperature of the flat layer to thereby change the refractive index of it. As a result, for example, when qualifying concentration at respective wavelengths for gas analysis or the like, the variation in the intensity of the laser light is suppressed, and therefore an S/N ratio can be stabilized to contribute to improving analysis accuracy.

It is preferable that one end and the other end of the waveguide are respectively provided with a reflective surface and a light lead-out surface, and an end surface of the flat layer serves as the reflective surface.

In such a configuration, even when the location of the reflective surface is displaced from a predetermined location by causes such as formation by cleavage, the adjustment of the refractive index of the flat layer by the temperature control makes it possible to adjust the phase of light reflected at the reflective surface ex post facto so as to be shifted to, for example, $\lambda/4$, and therefore non-defective products in which a wavelength jump hardly occurs can be manufactured in a high yield.

As a specific embodiment of the temperature control mechanism, one configured so that the temperature control mechanism includes a temperature control electrode provided in a site corresponding to the flat layer and the temperature of the flat layer can be controlled by applying current to the flat layer via the temperature control electrode can be cited.

It is preferable that the active layer is formed of a multiple quantum well structure in which multiple well layers are connected in a multistep manner, and light is generated by an optical transition between subbands formed in the quantum wells. In addition, the multiple well layers may be ones having different thicknesses.

As a semiconductor laser making the effects of the present invention more remarkable, a quantum cascade laser can be cited.

As a drive controller that controls driving of the semiconductor laser, one including: a temperature control part that controls the temperature control mechanism to control the temperature of the flat layer; and a laser drive part that injects current into the core layer to generate laser oscillation can be cited.

Advantageous Effects of Invention

According to the present invention configured as described, since an oscillation wavelength can be tuned while suppressing a variation in the intensity of laser light, for example, in the case of use for the component analysis of exhaust gas or the like, it is possible to improve the accuracy of the analysis.

Also, in the semiconductor laser in which an end surface of the flat layer is made to serve as the reflective surface, i.e., the flat layer is provided continuously with a terminal of the diffraction grating layer, for example, a phase shift at the reflective surface due to cleavage can be cancelled by the temperature control, and therefore defective products conventionally produced due to the phase shift can be suppressed from being produced, making it possible to dramatically improve a non-defective yield.

LIST OF REFERENCE CHARACTERS

100 Semiconductor laser device
1 Distributed feedback semiconductor laser
2 Drive controller
3, 4, 6 Clad layer
5 Core layer
51 Active layer
5a Reflective surface
5b Light lead-out surface
8 diffraction grating layer
9 Flat layer
S Temperature control mechanism
S1 Temperature control electrode

DESCRIPTION OF EMBODIMENTS

In the following, one embodiment of a laser device 100 according to the present invention will be described with reference to drawings.

Figure 1:
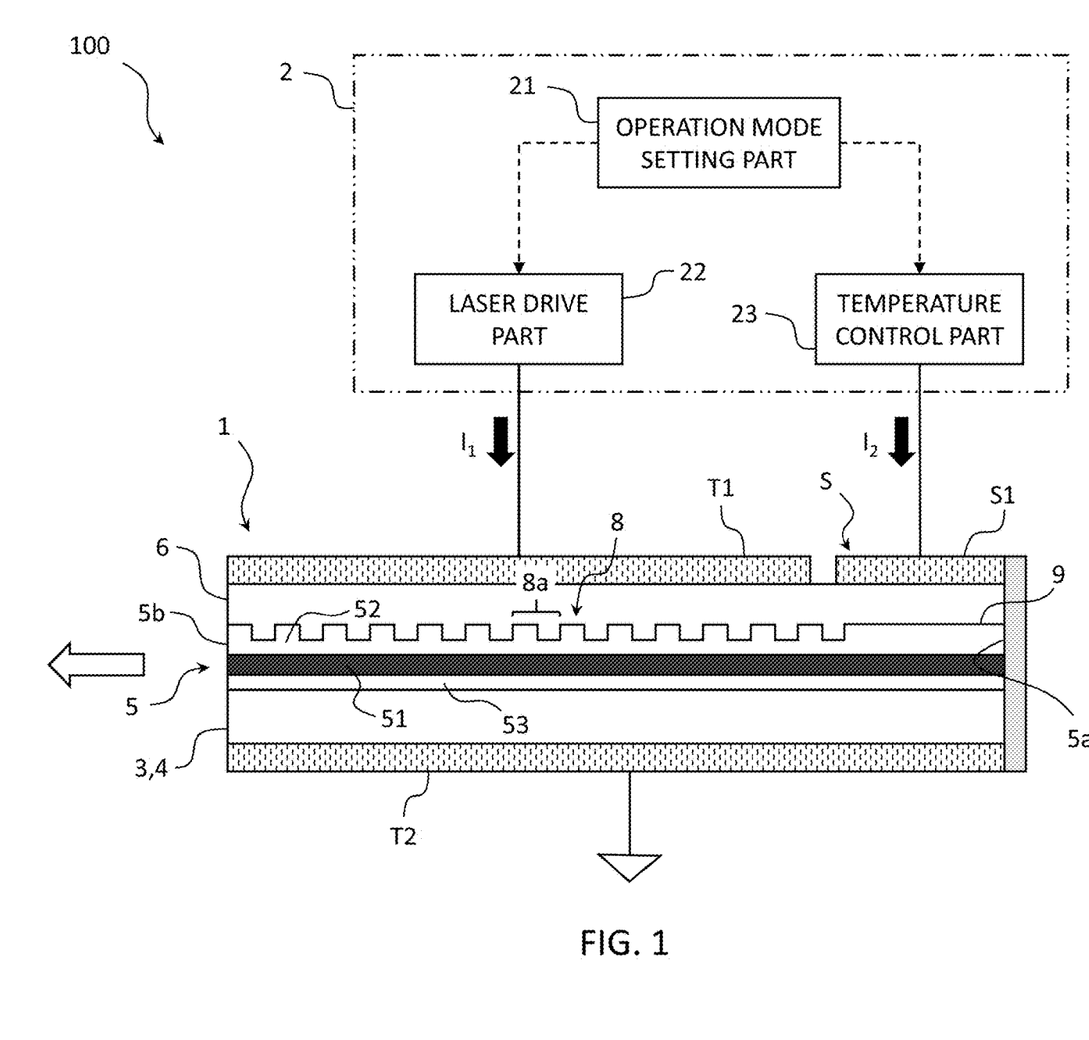
FIG. 1 is a schematic diagram illustrating the whole of a semiconductor laser device in one embodiment of the present invention.

As illustrated in FIG. 1, a laser device 100 in this embodiment is one provided with a semiconductor laser 1 and a drive controller 2 that controls driving of the semiconductor laser 1.

First, the semiconductor laser 1 will be described.

Figure 2:
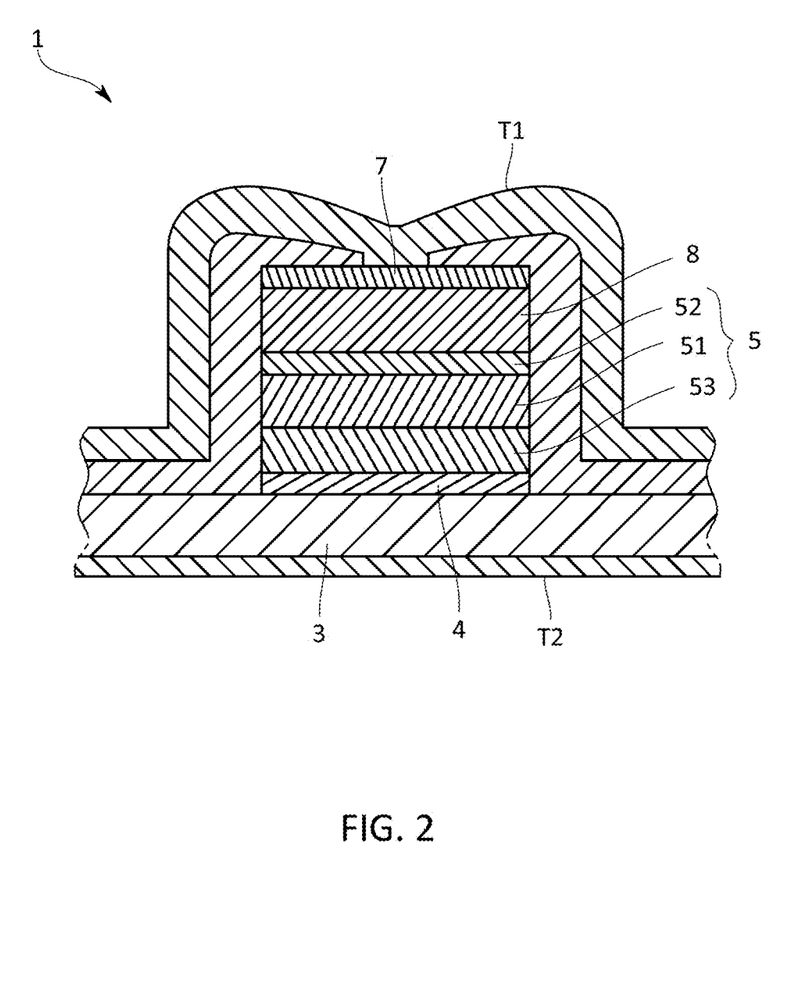
FIG. 2 is a cross-sectional view illustrating a semiconductor laser in the same embodiment.

This semiconductor laser 1 is a distributed feedback quantum well cascade laser (hereinafter also referred to as a QCL), and as illustrated in FIG. 1 and FIG. 2, for example, one in which on a substrate 3 made of n-InP, a buffer layer 4 and a core layer 5 made of InP, an upper clad layer 6 made of InP, and a cap layer 7 made of InGaAs are stacked in this order by crystal growth based on an MOCVD method, an MBE method, or the like. In addition, the buffer layer 4 and/or the substrate 3 function as a lower clad layer.

Also, on the lower surface of the substrate 3 and on the upper surface of the cap layer 7, a lower electrode T2 and an upper electrode T1 are respectively provided, and by applying voltage between these electrodes T1 and T2 to inject current having a threshold value or more into the core layer 5, the core layer 5 emits light and the semiconductor laser 1 generates laser oscillation.

The core layer 5 consists of: an active layer 51; and guide layers 52 and 53 provided above and below the active layer 51, and is one of a unipolar type in which semiconductor layers of the same type (n-type or p-type) are stacked.

The active layer 51 is one structured to connect multiple well layers having different thicknesses in a multistep manner, and in this embodiment, adapted to emit light having a mid-infrared or longer wavelength by the optical transitions between levels (subbands) present in the conduction band.

Describing more specifically, the active layer 51 is configured by alternately stacking a semiconductor layer serving as a light emitting region and a semiconductor layer serving as an injection region by a predetermined number. In this embodiment, the semiconductor layer serving as a light emitting region is configured by alternately stacking InGaAs and InAlAs and the semiconductor layer serving as an injection region is configured by alternately stacking InGaAs and InAlAs.

The guide layers 52 and 53 are ones made of InGaAs, and carry a function as a waveguide for propagating the light generated in the active layer 52.

Further, in this embodiment, a diffraction grating layer 8 in which diffraction grating s 8a are arrayed with a constant period Λ is formed by microgrooving the upper surface of the upper guide layer 52 of these guide layers 52 and 53 to form a one-dimensional stripe structure.

The diffraction grating layer 8 is optically coupled to the active layer 52, and the light generated in the active layer 52 travels in a direction (hereinafter also referred to as a waveguide direction) orthogonal to a groove direction while reflecting by the respective diffraction grating s 8a. At this time, only light having a constant wavelength determined by the period Λ of the diffraction gratings 8a is constantly acted on by the diffraction gratings 8a to remain long in the active layer 52, and is amplified to thereby generate the laser oscillation.

In addition, in the semiconductor laser 1, one end surface of the core layer 5 (the terminal surface in the waveguide direction) is a reflective surface 5a formed by cleavage, and the other end surface is subjected to non-reflection treatment to serve as a light lead-out surface 5b from which the laser light is led out.

Further, in this embodiment, a flat layer 9 is formed continuously with the diffraction grating layer 8 in the core layer 5.

The flat layer 9 is one formed by not microgrooving a certain area of the upper guide layer 52 on the reflective surface 5a side, and accordingly, one end surface of the flat layer 9 is continuous with the diffraction grating layer 8, whereas the other end surface serves as the reflective surface 5a. In addition, when changing a point of view, the flat layer 9 can also be said to be a part of the diffraction grating layer 8 and a part whose diffraction grating period is different from the other part.

Further, in this embodiment, a temperature control mechanism S for independently controlling the temperature of the flat layer 9 to a temperature different from that of the diffraction grating layer 8 is provided. The temperature control mechanism S in this embodiment is one including a temperature control electrode S1 provided above the flat layer 9.

The temperature control electrode S1 is one provided above the flat layer and on the upper surface of the cap layer 7, and disposed separated from the upper electrode T1 in the waveguide direction in an electrically unconnected state. Further, the flat layer 9 is configured so that the temperature thereof can be controlled by applying voltage to the temperature control electrode S1 to apply current to the flat layer 9 and thereby generating resistance heat. In addition, the resulting temperature change changes the refractive index of the flat layer 9; however, in the semiconductor laser 100 of this embodiment, the core layer 5 is one of a unipolar type as described above, and therefore the influence of the voltage on the refractive index of the flat layer 9 (the influence of the quantum confined Stark effect on the refractive index) does not occur.

Next, the drive controller 2 will be described.

Although not illustrated, the drive controller 2 is one consisting of: a digital electric circuit including a CPU, a memory, an I/O port, and the like; an analog electric circuit including an amplifier, a buffer, and the like; and an A/D converter, a D/A converter, and the like interposed between them, and the CPU and its peripheral devices cooperate in accordance with a predetermined program stored in the memory, thereby functioning as an operation mode setting part 21 that sets the operation mode of the semiconductor laser 1, a laser drive part 22 that supplies laser drive current $I^1$ to the upper electrode T1 to generate the light in the active layer 51, and a temperature control part 23 that supplies temperature control current $I_2$ to the temperature control electrode S1 to control the temperature of the flat layer 9 as illustrated in FIG. 1.

Next, the operation of the semiconductor laser device 100 configured as described will be described.

In this embodiment, roughly, two types of operation modes are prepared, and for example, when any of the operation modes is selected by a user's input, the operation mode setting part 21 receives it, and in accordance with the selected operation mode, the laser drive part 22 and the temperature control part 23 operate.

A first operation mode of the two types of operation modes is a mode that controls the temperature of the flat layer 9 to thereby change the refractive index thereof, and fixedly controls a phase at the end surface of the flat layer 9 to λ/4 to generate laser oscillation at a Bragg wavelength determined by the optical path length of the diffraction gratings 8a.

Describing more specifically, in the first operation mode, the temperature control part 23 applies voltage to the temperature control electrode of the QCL to apply the temperature control current $I_2$ toward the lower electrode T2. In addition, the value of the temperature control current $I_2$ may be larger or smaller than threshold current $I_{th}$ for laser oscillation.

In doing so, the resulting resistance heat changes the temperature of the flat layer 9 located between the temperature control electrode S1 and the lower electrode T2, and the refractive index is changed.

Figure 3:
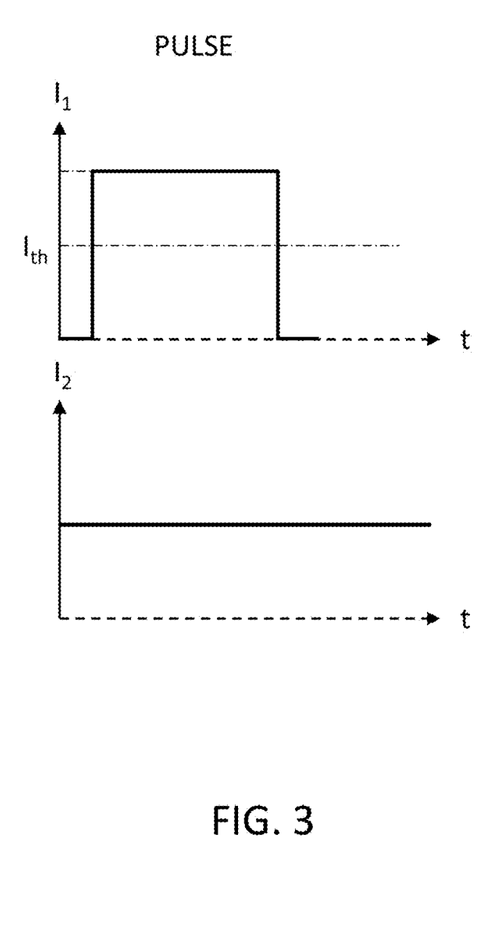
FIG. 3 is a diagram for explaining a method for driving the semiconductor laser in the same embodiment.

In this embodiment, the current causing the phase at the end surface of the flat layer 9 to be λ/4 is preliminarily measured, and as illustrated in FIG. 3, the temperature control part 23 applies the voltage causing the current to the temperature control electrode S1.

Further, as described, the laser drive part 22 applies the voltage to the upper electrode T1 with the phase at the end surface of the flat layer 9 controlled to λ/4 by the temperature control part 23, and injects the laser drive current, which is equal to or more than the threshold value $I_{th}$ and constant, into the active layer 51. In addition, in FIG. 3, an example of pulse oscillation is illustrated, but continuous oscillation is also possible.

A second operation mode is a mode that adjusts the wavelength of the laser light to a desired value while preventing a variation in the intensity of the laser light as much as possible.

In this second mode, the laser drive part 22 first applies the voltage to the upper electrode T1 to continuously inject the constant laser drive current equal to or more than the threshold value $I_{th}$ into the active layer 51. In doing so, the laser light is continuously oscillated, and a variation in the intensity of it is suppressed.

In this state, by temporally changing the temperature of the flat layer 9, the refractive index thereof is changed.

Figure 4:
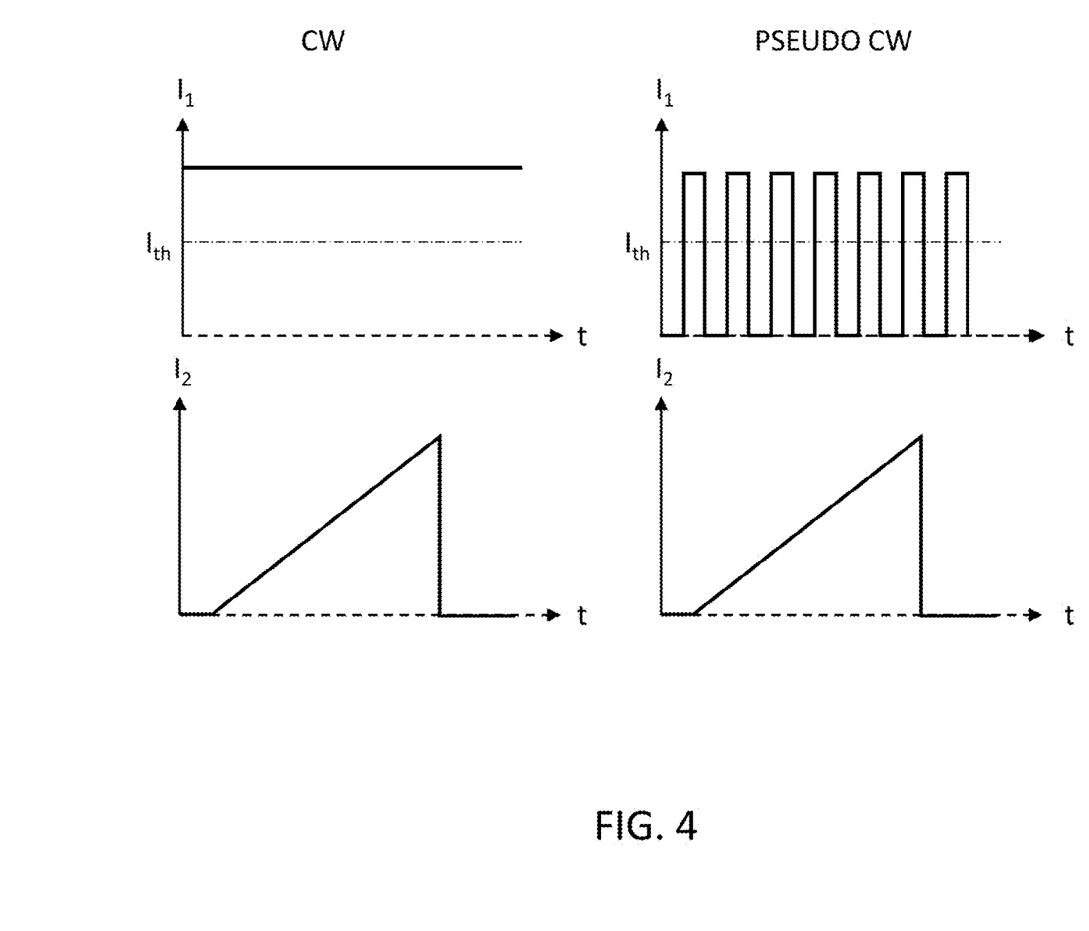
FIG. 4 is a diagram for explaining a method for driving the semiconductor laser in the same embodiment.

More specifically, the temperature control part 23 changes the temperature control current $I_2$ with time as illustrated in FIG. 4. This allows the temperature of the flat layer 9 to be changed with time, and correspondingly, the refractive index of the flat layer 9 is also temporally changed.

As a result, the phase at the end surface of the flat layer 9 is temporally changed, and a laser oscillation wavelength is temporally changed, i.e., swept. Here, the wavelength of the laser light is adapted to be swept within a stop bandwidth around λ/4 by controlling the phase at the end surface of the flat layer 9.

In addition, as illustrated in the same diagram, the laser drive part 22 may allow laser oscillation to be generated using repetitive pulses. This is pseudo continuous oscillation of laser light.

Further, according to the semiconductor laser device 100 as described above, the following effects can be produced.

First, since a phase shift at the reflective surface 5a due to cleavage can be cancelled by the temperature control, defective products in which a wavelength jump is caused by the phase shift can be suppressed from being produced, making it possible to dramatically improve a non-defective yield.

For example, since in the first operation mode, the light phase at the reflective surface 5a is controlled to λ/4 regardless of a shift in cleavage, the most effective feedback can be obtained to enable laser oscillation in a single wavelength mode without a wavelength jump.

Also, since as in the second operation mode, the oscillation wavelength of the laser light can be changed while continuing to prevent a variation in the intensity of the laser light as much as possible, for example, when quantifying concentration at respective wavelengths for gas analysis or the like, the intensity of the laser light is not significantly varies among the respective wavelengths, and therefore an S/N ratio can be stabilized to contribute to improving analysis accuracy.

In addition, the present invention is not limited to the above-described embodiment.

Figure 5:
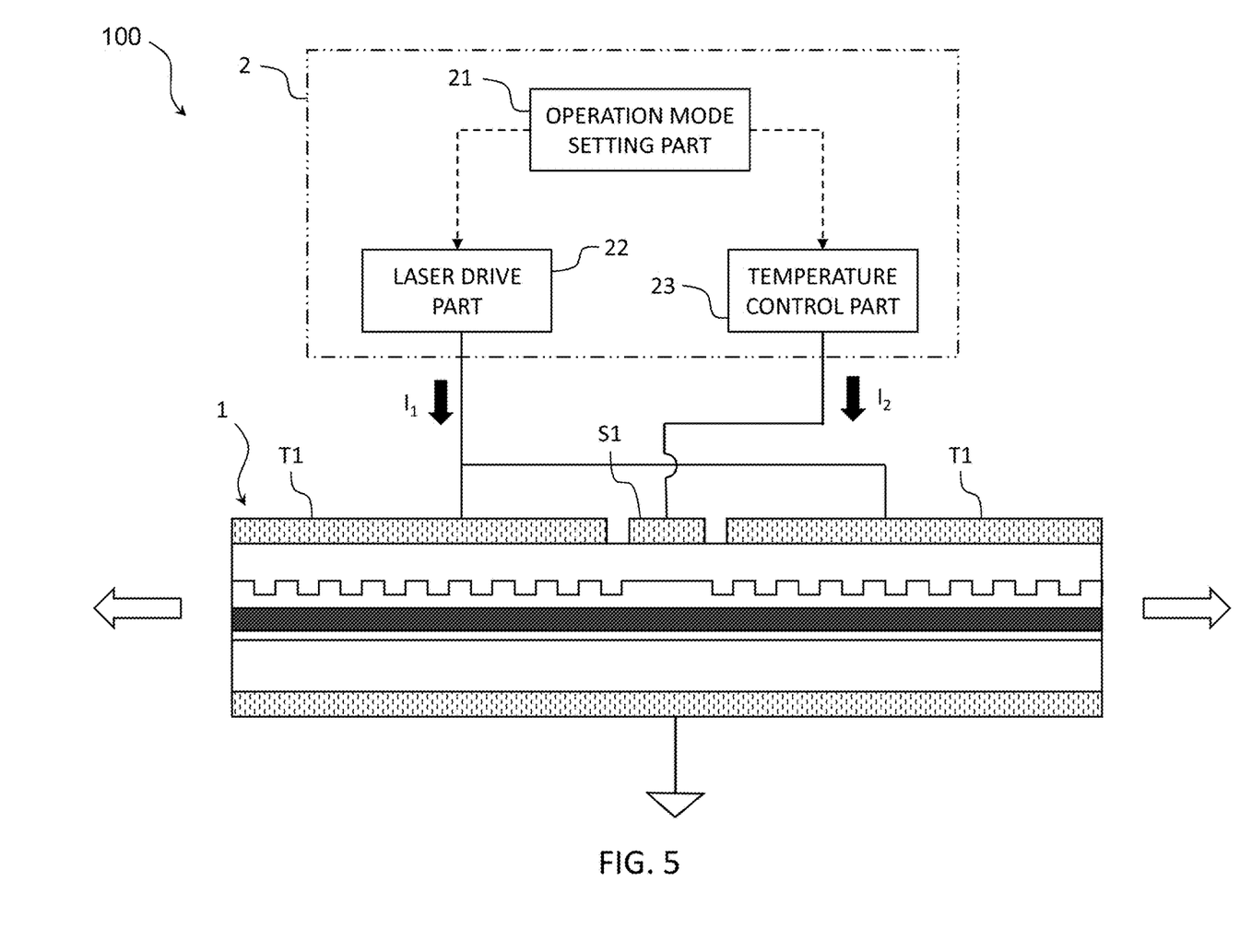
FIG. 5 is a schematic diagram illustrating the whole of a semiconductor laser device in another embodiment of the present invention.

For example, as illustrated in FIG. 5, the flat layer 9 may be provided in the diffraction grating layer 8. The temperature control electrode S1 and the upper electrode T1 are provided above the flat layer 9 and above the diffraction grating layer 8 respectively separately.

Since such a semiconductor laser 100 is not provided with a reflective surface, laser light is outputted from both end surfaces; however, as in the above-described embodiment, an oscillation wavelength can be controlled by changing the temperature of the flat layer 9 and therefore changing the refractive index thereof.

Also, in the above-described embodiment, the phase at the reflective surface 5a is controlled in a feedforward-like manner that applies a predetermined constant current to the temperature control electrode S1; however, for example, the temperature control part 23 may be adapted to perform the feedback control of current (or voltage) to be applied to the temperature control electrode S1 so that with an oscillation wavelength monitored, the oscillation wavelength becomes equal to a Bragg wavelength, or alternatively the temperature control part 23 may be adapted to perform the feedback control or the like of voltage (current) so that with a temperature sensor for directly or indirectly measuring the temperature of the flat layer 9 provided, the temperature by the temperature sensor becomes equal to a desired temperature.

The temperature control mechanism is not one based on current but may be one using a Peltier element or a refrigerant.

Further, the present invention is applicable not only to a quantum cascade laser but also to another type of semiconductor laser as long as it has a DFB structure and also to a semiconductor laser having a DBR structure.

Besides, the present invention is not limited to the above-described embodiments, but can be variously modified without departing from the scope thereof.

INDUSTRIAL APPLICABILITY

According to the present invention, since an oscillation wavelength can be tuned while suppressing a variation in the intensity of laser light, for example, in the case of use for the component analysis of exhaust gas or the like, it is possible to improve the accuracy of the analysis.

The invention claimed is:

1. A semiconductor laser comprising: a core layer having an active layer and a diffraction grating layer optically coupled to the active layer; a first clad layer; and a second clad layer, the core layer sandwiched between the first clad layer and the second clad layer, and formed with a waveguide along the core layer, the semiconductor laser comprising:
   a flat layer provided continuously with the diffraction grating layer along the waveguide; and
   a temperature control mechanism for controlling temperature of the flat layer to a temperature different from the diffraction grating layer, wherein
   the diffraction grating layer and the flat layer are both formed between the active layer extending along the waveguide and the first clad layer, and
   the temperature control mechanism is configured to control the temperature of the flat layer such that a laser oscillation wavelength is swept within a stop bandwidth around a same wavelength as a laser having a $\lambda/4$ shift structure.

2. The semiconductor laser according to claim 1, wherein
   a first end and a second end of the waveguide are respectively provided with a reflective surface and a light lead-out surface, and
   an end surface of the flat layer serves as the reflective surface.

3. The semiconductor laser according to claim 1, configured so that
   the temperature control mechanism is one including a temperature control electrode provided in a site corresponding to the flat layer, and the temperature of the flat layer can be controlled by applying current to the flat layer via the temperature control electrode.

4. The semiconductor laser according to claim 1, wherein
   the active layer is formed of a multiple quantum well structure in which multiple well layers are connected in a multistep manner, and light is generated by an optical transition between subbands formed in the quantum wells.

5. The semiconductor laser according to claim 1, being a quantum cascade laser.

6. A drive controller that controls driving of the semiconductor laser according to claim 1, the drive controller comprising:
   a temperature control part that controls the temperature control mechanism to control the temperature of the flat layer; and a laser drive part that injects current into the core layer to generate laser oscillation.

7. A method for controlling the semiconductor laser according to claim 1, wherein
   while injecting current into the core layer to generate laser oscillation at a constant output, a wavelength of laser light to be outputted is changed by changing the temperature of the flat layer with use of the temperature control mechanism.

* * * * *